United States Patent [19]

Carson et al.

[11] Patent Number: 5,543,583
[45] Date of Patent: Aug. 6, 1996

[54] CONDUCTIVE SOLDER PAD FOR BONDING AN ELECTRONIC DEVICE TO A CERAMIC SUBSTRATE

[75] Inventors: Robert T. Carson, Lantana; Lisa Reckleben, Boynton Beach; Arnold W. Hogrefe, Ft. Lauderdale, all of Fla.

[73] Assignee: Motorola, Inc., Schaumburg, Ill.

[21] Appl. No.: 542,122

[22] Filed: Oct. 12, 1995

Related U.S. Application Data

[62] Division of Ser. No. 331,465, Oct. 31, 1994.

[51] Int. Cl.$^6$ ..................................................... H05K 1/09
[52] U.S. Cl. ........................... 174/257; 174/261; 361/771
[58] Field of Search ..................................... 174/257, 261, 174/250, 256; 361/771, 767

[56] References Cited

U.S. PATENT DOCUMENTS

| | | | |
|---|---|---|---|
| 4,740,657 | 4/1988 | Tsukagoshi et al. | 174/88 |
| 5,120,665 | 6/1992 | Tsukagoshi et al. | 437/8 |
| 5,145,532 | 9/1992 | Fukunagawa et al. | 148/23 |
| 5,154,341 | 10/1992 | Melton et al. | 228/180.2 |
| 5,307,508 | 4/1994 | Rollins et al. | 455/38.1 |
| 5,317,308 | 5/1994 | Tribbey et al. | 340/825.44 |
| 5,381,307 | 1/1995 | Hertz et al. | 361/767 |

*Primary Examiner*—Laura Thomas
*Attorney, Agent, or Firm*—James A. Lamb

[57] ABSTRACT

A solder pad for mechanically and electrically coupling solder terminals (420) of electronic devices (410) to a non-conductive ceramic substrate (130) includes a solder pad portion (110) of a conductive runner (120) and a solder wettable layer (210). The solder pad portion (110) of the conductive runner (120) is on the non-conductive ceramic substrate (130). The conductive runner (120) consists essentially of a conductive ceramic material. The solder wettable layer (210) is attached to the solder pad portion (110). The solder wettable layer (210) includes at least 50% indium by weight.

4 Claims, 5 Drawing Sheets

900

CONDUCTIVE SOLDER PAD FOR BONDING AN ELECTRONIC DEVICE TO A CERAMIC SUBSTRATE

This is a divisional of application Ser. No. 08/331,465, filed Oct. 31, 1994.

FIELD OF THE INVENTION

This invention relates in general to means for electrical connection, and in particular to an electrical conductor usable on a ceramic substrate for soldering to other electrical conductors.

BACKGROUND OF THE INVENTION

Known means of connecting metallic electrical circuits, such as flexible circuits and terminals on integrated circuits, to conductors on a ceramic substrate, such as indium-tin oxide (ITO) conductors on a glass substrate, include the use of a conductive adhesive, the use of a anisotropic conductive medium pressed between the metallic electrical circuits and the conductors on the ceramic material, and the use of solder.

While each of these means has been used successfully, they each have drawbacks. Conductive adhesives can be susceptible to thermal cycling fatigue, which causes a gradual rise of resistance of the connections, and are typically non-repairable. Anisotropic conductors are often used for connecting a plurality of the metallic conductors arranged in a row to a plurality of the conductors on the ceramic, by pressing the anisotropic medium between the rows of conductors, the pressure induced by backing plates or adhesives. Either approach to achieving the necessary pressure tends to suffer from non-uniformity of pressure, thus leading to non-uniform conductivity of the electrical connections. For making solder connections possible, a technique currently used is to fabricate solder pads on ITO conductors by sputtering three successive layers of materials over the ITO conductors at solder pad areas. The layers are sputtered in the following order: titanium tungsten, nickel, then gold. This process, while providing good solder pads, is expensive.

Thus, what is needed is a low cost means for providing a reliable conductive bond between metallic conductors and ceramic conductors on ceramic substrates.

SUMMARY OF THE INVENTION

Accordingly, in a first aspect of the present invention, a solder pad for mechanically and electrically coupling solder terminals of electronic devices to a non-conductive ceramic substrate includes a solder pad portion of a conductive runner and a solder wettable layer. The solder pad portion of the conductive runner consists essentially of a conductive ceramic substrate. The conductive runner consists essentially of a conductive ceramic material. The solder wettable layer is attached to the solder pad portion. The solder wettable layer includes at least 50% indium by weight.

DETAILED DESCRIPTION OF THE DRAWINGS

Figure 1:
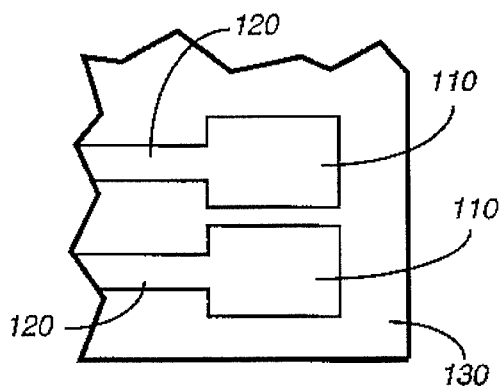
FIG. 1 is a mechanical top view diagram of solder pad areas of conductors on a glass substrate, in accordance with the preferred embodiment of the present invention.

Referring to FIG. 1, a mechanical top view diagram of solder pad areas 110 of conductors 120 on a glass substrate 130 is shown, in accordance with the preferred embodiment of the present invention. The glass substrate 130 is a portion of a liquid crystal display. The glass substrate is conventional glass, made of a mixture of oxides which form a transparent or translucent solid following a high temperature fusing process. Conventional glass is in the class of materials known as ceramics. The conductors 120 on the glass are conventional indium-tin oxide (ITO) platings on the surface of the glass substrate 130. The conductors have solder pad areas 110, to which solder terminals of other electrical components can be soldered.

Figure 2:
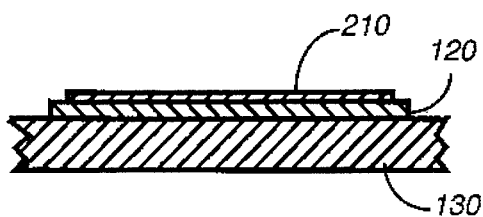
FIG. 2 is a mechanical cross section diagram through one of the solder pad areas of the conductors on the glass substrate, in accordance with the preferred embodiment of the present invention.

Referring to FIG. 2, a mechanical cross section diagram through one of the solder pad areas 110 of one of the conductors 120 on the glass substrate 130 is shown, in accordance with the preferred embodiment of the present invention. In the solder pad area 110 of the conductor 120, the solder pad area 110 comprises an indium alloy 210 plated on the conventional ITO conductor 120. The ITO conductor 120, in turn, has been plated, by conventional techniques to the glass substrate 130. The indium alloy 210 comprises at least 50% by weight of indium. The remaining portion of the indium alloy 210 which is not indium consists essentially of at least one of the group of elements consisting of lithium, sodium, calcium, magnesium, potassium, phosphorus, tin, bismuth, gallium, germanium, and lead. Neither solder flux nor other organic materials are ingredients of the indium alloy 210. The indium alloy 210 forms an excellent attachment to the ITO conductor 120 and is easily wettable to conventional solder mixtures, such as those used for wave soldering or infrared reflow soldering processes.

Figure 3:
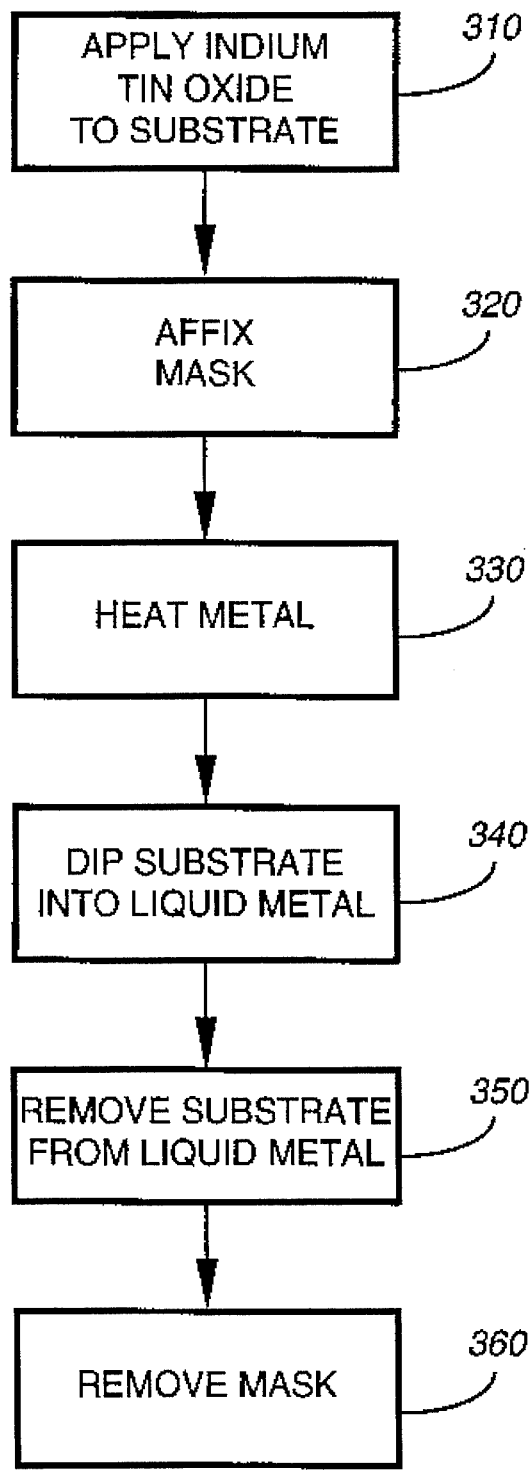
FIG. 3 is a flow chart of a method used to fabricate the solder pad areas of the conductors on the glass substrate, in accordance with the preferred embodiment of the present invention.

Referring to FIG. 3, a flow chart of a method used to fabricate the solder pad areas 110 of the conductors 120 on the glass substrate 130 is shown, in accordance with the preferred embodiment of the present invention. At step 310 the conductors 120 are applied to the surface of the glass substrate 130 in a conventional manner, for example, by sputter deposition or chemical vapor deposition, forming a thin conductive ceramic layer of ITO. A plating mask is affixed to the surface of the glass substrate 130 at step 320. The plating mask covers all areas of the glass substrate 130 and conductors 120 except the solder pad areas 110 of the conductors 120, which are exposed. The plating mask is preferably comprised of Teflon™, which is resistant to high temperatures, adherence by metals, and is reusable. Alternative materials having similar characteristics may be used instead of Teflon™. At step 330 a container of the indium alloy 210 is heated above the melting point of the indium alloy 210. The surface of the glass substrate 130 having the plating mask affixed thereto is dipped into the container having the molten indium alloy 210 at step 340, causing the indium alloy to plate the solder pad areas 110 of the conductors 120 exposed by the plating mask. The molten indium alloy, unlike conventional solders which include organic materials, wets well to the conductive ceramic conductor, 120 forming a strong bond thereto, and when resolidified, provides a surface wettable by conventional solders. The applicant believes this happens because, as the indium alloy 210 plates the conductors 120, the molten metal of the alloy 210 pushes through an oxide layer which forms on the surface of the molten alloy due to the presence of oxygen, allowing the indium in the molten metal to enhance formation of a chemical bond with the ceramic conductor material 120 and also to enhance a flowing of the molten metal into microscopic features formed in the surface of the conductor-over-glass surface, forming a strong mechanical bond with the conductor-over-glass surface. The glass substrate 130 is removed from the container, at step 350, and the mask is removed at step 360. The unique use of the molten indium alloy provides a plating that covers essentially all exposed solder pad areas 110, which is attached firmly to the conductor 120 and wets to solder well. It will be appreciated that other methods exist for applying the molten indium alloy to the solder pads 110. For example, the side of the substrate 130 having the mask can be faced upward and the molten alloy can be poured or spread over the plating mask and exposed solder pad areas 110.

Figure 4:
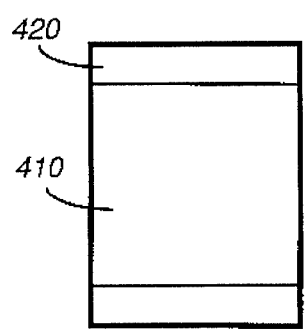
FIG. 4 is a mechanical top view diagram of a surface mount capacitor which is for connecting to the solder pad areas of the glass substrate, in accordance with the preferred embodiment of the present invention.

Referring to FIG. 4, a mechanical top view diagram of a surface mount capacitor 410 which is for connecting to the solder pad areas 110 of the glass substrate 130 is shown, in accordance with the preferred embodiment of the present invention. The surface mount capacitor 410 has metal plated ends 420 which are intended for solder connection to an electronic circuit.

Figure 5:
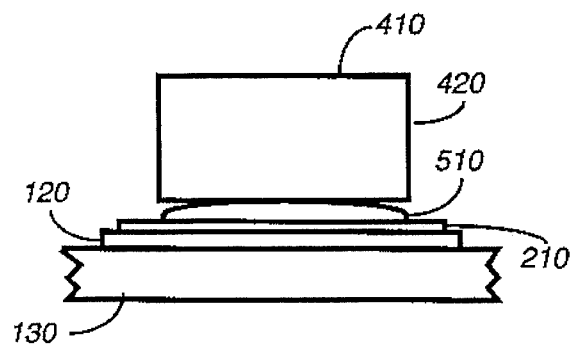
FIG. 5 is a side view of the surface mount capacitor on top of a solder pasted pad area on the glass substrate, prior to a solder operation, in accordance with the preferred embodiment of the present invention.

Referring to FIG. 5, a side view of the surface mount capacitor 410 on top of a solder pasted pad area 110 on the glass substrate 130 is shown, prior to a solder operation, in accordance with the preferred embodiment of the present invention. The solder pad area 110 has had a solder paste 510 applied thereon in a conventional manner. Alternatively, the solder pad area 110 can be pre-tinned in a conventional manner. With either the solder paste 510 or pre-tinning preparation of the solder pad area 110, the surface mount capacitor 410 is ready to be soldered to the solder pad area 110 of the glass substrate 130.

Figure 6:
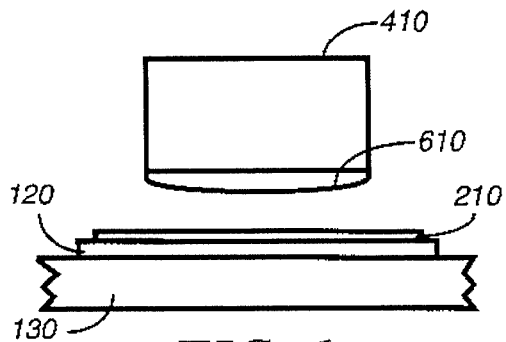
FIG. 6 is a side view of the surface mount capacitor which is pretinned, on top of the solder pad area on the glass substrate, prior to a solder operation, in accordance with the preferred embodiment of the present invention.

Referring to FIG. 6, a side view of the surface mount capacitor 410 which is pre-tinned, above the solder pad area 110 on the glass substrate 130, prior to a solder operation is shown, in accordance with the preferred embodiment of the present invention. In this approach, the surface mount capacitor 410 is pre-tinned with solder 610 on the metal plated ends 420, with sufficient solder to provide a good connection between the surface mount capacitor 410 and the solder pad areas 110. With the pretinning preparation of the surface mount capacitor 410, the surface mount capacitor 410 is ready to be soldered to the solder pad area 110 of the glass substrate 130.

Figure 7:
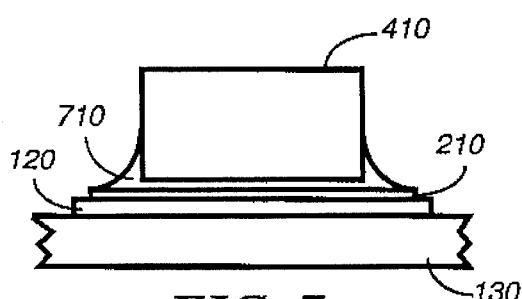
FIG. 7 is a side view of the surface mount capacitor soldered to the solder pad area on the glass substrate, in accordance with the preferred embodiment of the present invention.

Referring to FIG. 7, a side view of the surface mount capacitor 410 soldered to the solder pad area 110 on the glass substrate 130 is shown, in accordance with the preferred embodiment of the present invention. The soldering is performed in a conventional manner, resulting in a good solder joint 710 which is thoroughly wetted to the entire solder pad area, providing excellent mechanical attachment and electrical connectivity between the surface mount capacitor 410 and the conductors 120 on the glass substrate 130.

It will be appreciated that solder pad areas 110 can alternatively be provided on ITO conductors on other ceramic substrates, such a those used for integrated circuit packaging and PLZT displays, thereby providing the same advantages as described herein for electrically connecting and mechanically attaching devices to glass substrates, in accordance with the preferred embodiment of the present invention.

Figure 8:
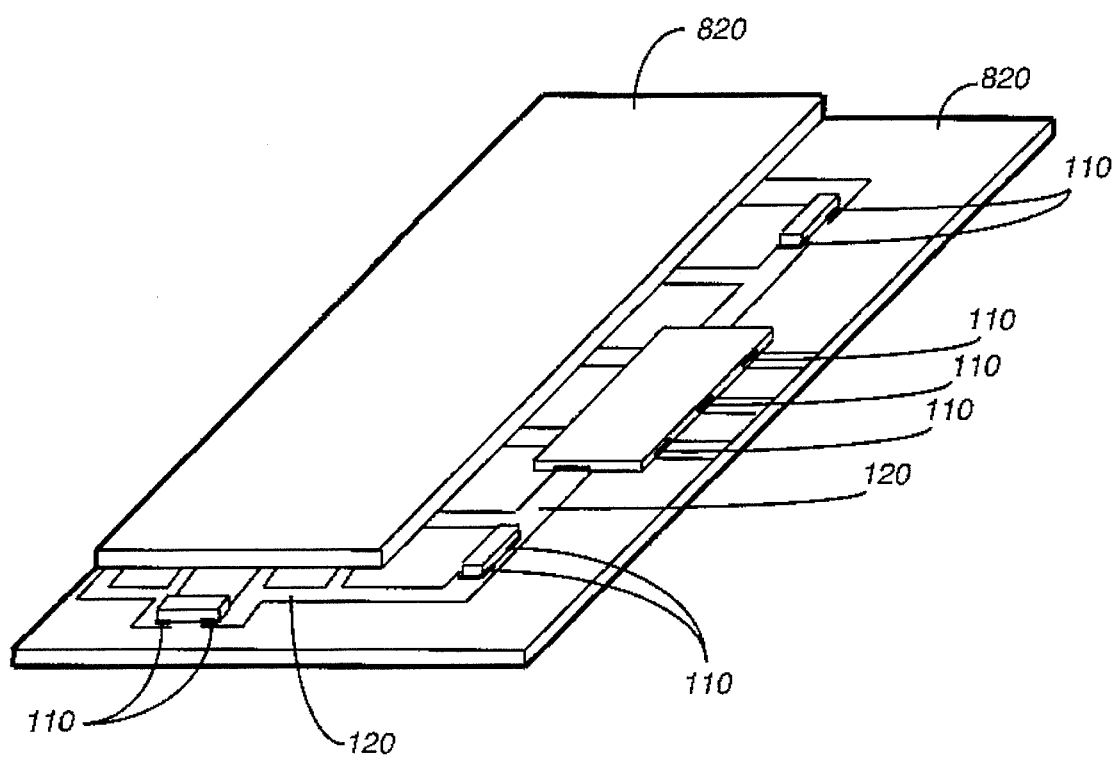
FIG. 8 is an isometric view of a liquid crystal display having an integrated circuit and surface mounted capacitors soldered thereto, in accordance with the preferred embodiment of the present invention.

Referring to FIG. 8, an isometric view of a liquid crystal display 800 having an integrated circuit 810 and surface mount capacitors 410 soldered thereon is shown, in accordance with the preferred embodiment of the present invention. The solder pad areas 110 are on conductors 120 which are on one of two pieces of glass 820 which form the liquid crystal display 800. The liquid crystal display is conventional except for the solder pad areas, which are fabricated in accordance with the preferred embodiment of the present invention. Although not shown in FIG. 8, the liquid crystal display is connected to other electronic circuitry by a flat multiconductor flexible circuit, which is soldered to solder pad areas 110 on the liquid crystal display 800 which are also fabricated using the unique indium alloy described above.

Figure 9:
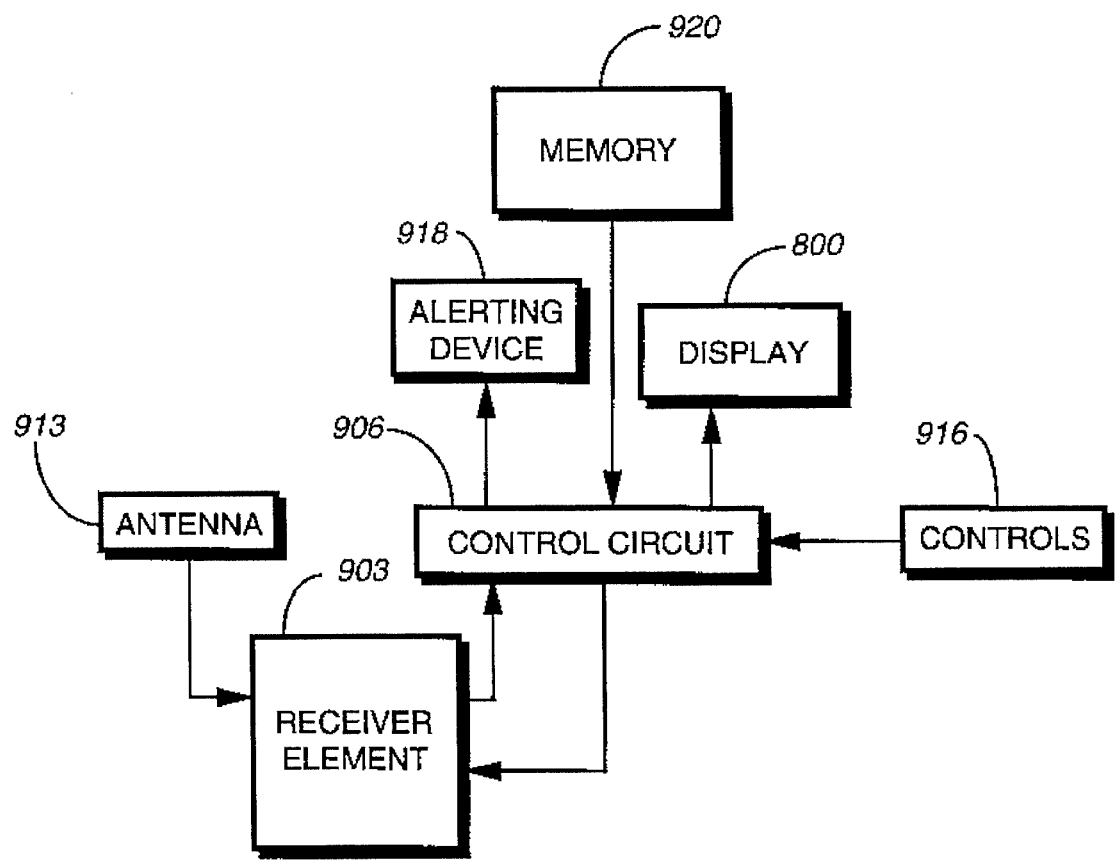
FIG. 9 is a first electrical block diagram of a selective call receiver 900 which uses the glass display, in accordance with the preferred embodiment of the present invention.

Referring to FIG. 9, a first electrical block diagram of a selective call receiver 900 which uses the liquid crystal display 800 is shown, in accordance with the preferred embodiment of the present invention. The selective call receiver 900 operates in a radio communication system to intercept a radio signal having a predetermined carrier frequency which is frequency modulated (FM) with a digital signal. The radio signal is intercepted using an antenna 913 which is coupled to a receiver element 903. The receiver element 903 operates to amplify, convert, filter, and demodulate the intercepted radio signal. The demodulated signal is coupled from the receiver element 903 to a control circuit 906, which includes conventional control logic for decoding the demodulated signal, including a selective call message, in a manner well known to one of ordinary skill in the art. The control circuit generates a local oscillator control signal which is coupled to the receiver element 903. The local oscillator control signal is used in the receiver element 903 to control a local oscillator which converts the received signal into an intermediate frequency (IF) signal by converting the carrier frequency into an intermediate frequency, in a conventional manner well known to one of ordinary skill in the art. The selective call message comprises an address, and may include other information such as a telephone number, alphanumeric data, or graphics. A conventional memory 920, which stores a predetermined address, is coupled to the control circuit 906. The control circuit 906 is further coupled to a display 800 and a sensible alerting device 918. The control circuit 906 compares the address recovered from the selective call message to the predetermined address stored in the memory 920 and continues processing the message when the comparison meets predetermined criteria. When the comparison does not meet predetermined criteria, the selective call receiver 900 stops the processing of the selective call message. When the comparison does meet the predetermined criteria, the control circuit 906 further processes the message as determined by the contents of the recovered selective call message and the settings of controls 916. The selective call receiver 900 may further process the selective call message by presenting at least a portion of the selective call message, using the display 800, and by signaling a user via the sensible alerting device 918 that a selective call message has been received. The information which is displayed can include a short message such as a phone number or a longer message such as a alphanumeric inquiry or a small map, any of which can be presented on the display 800 by manipulation of the controls 916 on the selective call receiver 900. It will be appreciated that the selective call receiver 900 could be of the type which also transmits messages and/or acknowledgments by means of radio signals. In the preferred embodiment of the present invention, the display 800 is coupled to the controller by a flexible circuit which is soldered to the display 800 using the unique solder pads described herein, and a ceramic filter is used in the receiver element 903 to filter the received radio signal. It will be appreciated that the selective call receiver 900 may, in addition to the liquid crystal display 800, use one or more other electronic components which are fabricated using ceramic substrates having solder pads 110 in accordance with the preferred embodiment of the present invention, for example, a ceramic packaged integrated circuit.

The selective call receiver 900 is preferably similar to a Memo Express® model pager, manufactured by Motorola, Inc., of Schaumburg, Ill., but may alternatively may be another of many selective call receiver radios modified similarly.

Figure 10:
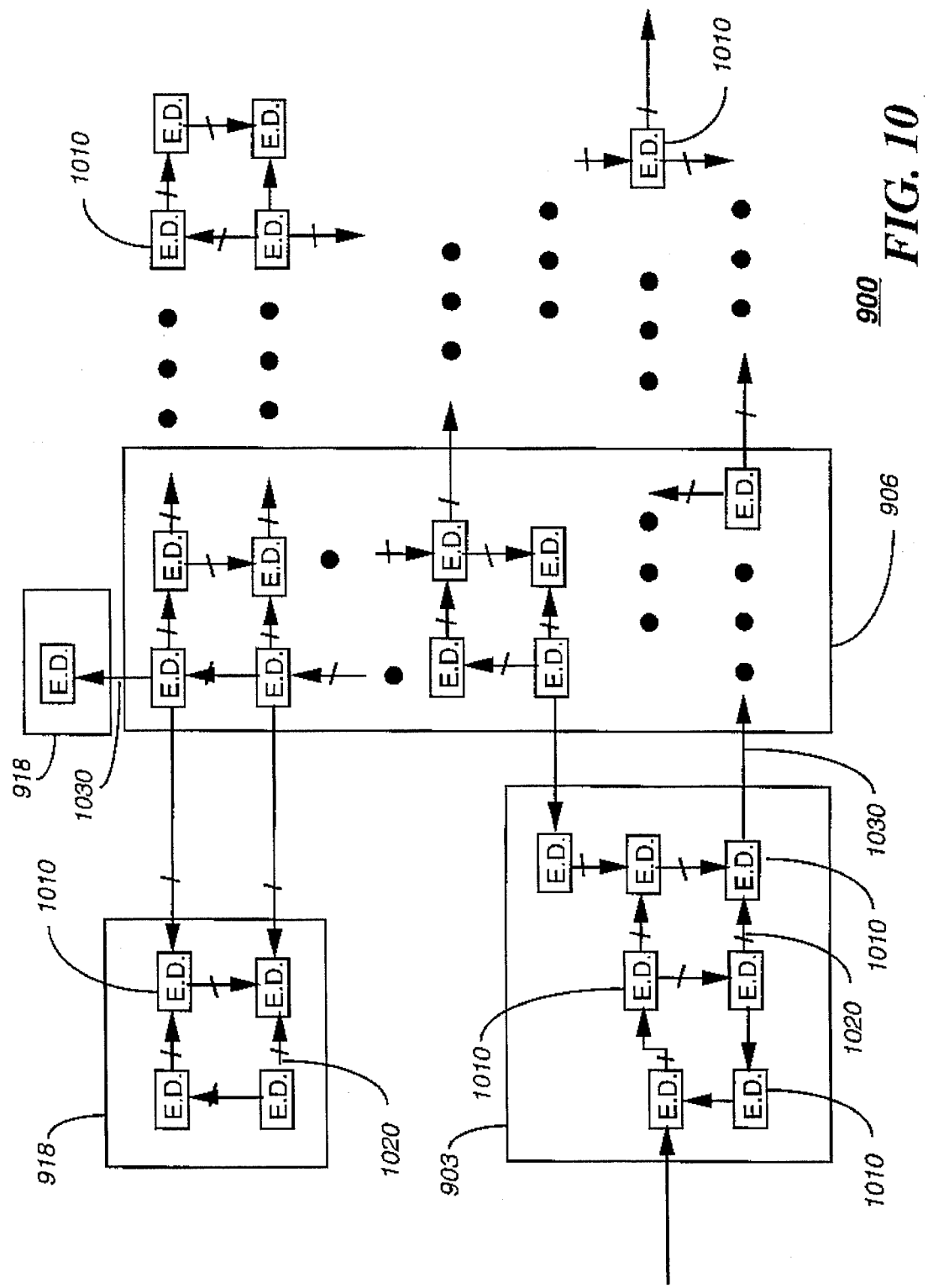
FIG. 10 is a second electrical block diagram of the selective call receiver 800, in accordance with the preferred embodiment of the present invention.

Referring to FIG. 10, a second electrical block diagram is shown of the selective call receiver 900, in accordance with the preferred embodiment of the present invention. The selective call receiver 900 comprises a set of interconnected circuit devices (ED) 1010, including integrated circuits, integrated circuit substrates, integrated circuit die, resistors, capacitors, cables, a display having conductors for mounting display drive electronics thereto, display drive electronics, an audio transducer, circuit boards, switches, inductors, capacitors, indicators, etc. Some of the electronic devices are items which are typically integrated and sold as piece parts, such as integrated circuit die and substrates. A first subset of the interconnected circuit devices forms the receiver element 903. A second subset of the interconnected circuit devices forms the control circuit 906. A third subset of the interconnected circuit devices forms the sensible alert 918. Not all circuit devices and interconnections used in the selective call receiver 900 are shown in FIG. 10. Some of the interconnections between devices are multiconductor connections 1020, and some are single interconnects 1030. A first device of the set of interconnected circuit devices 1010 comprises a ceramic substrate having one or solder pads 110. The substrate is a glass portion of the liquid crystal display 800, but alternatively could be a portion of a ceramic package for an integrated circuit. The ceramic packaged integrated circuit may be, for example, a phase lock loop circuit, a microprocessor, or a voltage regulator. The solder pads 110 comprise a solder pad area 110 of an electrical conductor 120 on the ceramic substrate 130 and a solder wettable layer 210 attached to the solder pad portion. The electrical conductor comprises a conductive ceramic material. The solder wettable layer 210 comprises at least 50% indium by weight. A second device of the interconnected circuit devices comprises an electronic component having one or more circuit terminals which are soldered to the solder pads 110 of the first device of the set of interconnected circuit devices. The electronic component is, for example, a liquid crystal display column driver attached to the glass portion of the liquid crystal display or a phase lock loop integrated circuit die attached to the portion of the ceramic package of the integrated circuit.

The selective call receiver 900 is representative of other portable and mobile devices which use ceramic substrates for such components as glass displays, ceramic integrated circuits, and ceramic filters. Other such portable devices include portable and mobile telephones and portable and mobile communication transceivers such as trunked radios.

It will be appreciated that in prior art devices, connection of electrical devices such as flexible cables, integrated circuits, and components to ITO conductors on ceramic substrates such as glass has been done primarily by adhesives or pressure. By now it should be appreciated that there has been described solder pad areas 110 which provide a unique solder wettable surface, allowing convenient soldering to the solder pad areas and which provides inexpensive and reliable electrical and mechanical bonding to the ceramic conductors on a ceramic substrate.

We claim:

1. A solder pad for mechanically and electrically coupling solder terminals of electronic devices to a non-conductive ceramic substrate, comprising:

a solder pad portion of a conductive runner on the nonconductive ceramic substrate, wherein said conductive runner consists essentially of a conductive ceramic material; and a solder wettable layer attached to said solder pad portion, said solder wettable layer comprising at least 50% indium by weight.

2. The solder pad according to claim 1, wherein said solder wettable layer consists essentially of at least 50% indium by weight and at least one of a group of elements consisting of lithim, sodium, calcium, magnesium, potassium, phosphorus, tin, bismuth, gallium, germanium, and lead.

3. The solder pad according to claim 1, wherein the non-conductive ceramic substrate is a glass substrate.

4. The solder pad according to claim 1, wherein the conductive ceramic material is a layer of indium tin oxide.

* * * * *

UNITED STATES PATENT AND TRADEMARK OFFICE
CERTIFICATE OF CORRECTION

PATENT NO. : 5,543,583
DATED : August 6, 1996
INVENTOR(S) : Carson, et al.

It is certified that error appears in the above-indentified patent and that said Letters Patent is hereby corrected as shown below:

Claim 2, column 6, line 53, change "lithim" to --lithium--.

Signed and Sealed this

Twenty-sixth Day of November 1996

Attest:

BRUCE LEHMAN

Attesting Officer     Commissioner of Patents and Trademarks